United States Patent
Chang et al.

(10) Patent No.: US 11,107,886 B2
(45) Date of Patent: Aug. 31, 2021

(54) MEMORY DEVICE AND METHOD OF FABRICATING THE MEMORY DEVICE

(71) Applicant: TAIWAN SEMICONDUCTOR MANUFACTURING COMPANY LTD., Hsinchu (TW)

(72) Inventors: Chih-Yu Chang, New Taipei (TW); Sai-Hooi Yeong, Hsinchu County (TW); Yu-Ming Lin, Hsinchu (TW); Chih-Hao Wang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 22 days.

(21) Appl. No.: 16/739,868

(22) Filed: Jan. 10, 2020

(65) Prior Publication Data

US 2021/0217847 A1 Jul. 15, 2021

(51) Int. Cl.
| | |
|---|---|
| H01L 29/06 | (2006.01) |
| H01L 29/66 | (2006.01) |
| H01L 27/11587 | (2017.01) |
| H01L 27/088 | (2006.01) |
| H01L 29/78 | (2006.01) |
| G11C 11/22 | (2006.01) |

(52) U.S. Cl.
CPC ........ *H01L 29/0673* (2013.01); *G11C 11/223* (2013.01); *H01L 27/0886* (2013.01); *H01L 27/11587* (2013.01); *H01L 29/6684* (2013.01); *H01L 29/66795* (2013.01); *H01L 29/785* (2013.01); *H01L 29/78391* (2014.09)

(58) Field of Classification Search
CPC .............. H01L 29/0673; H01L 29/785; H01L 27/0886; H01L 29/66795; H01L 29/6684; H01L 29/78391; H01L 27/11587; G11C 11/223
USPC ............................................. 257/295; 438/3
See application file for complete search history.

(56) References Cited

U.S. PATENT DOCUMENTS

| | | | |
|---|---|---|---|
| 2018/0114833 A1* | 4/2018 | Bao ..................... | H01L 29/0673 |
| 2018/0308699 A1* | 10/2018 | Yeung .................. | H01L 29/7848 |
| 2019/0109191 A1* | 4/2019 | Miao .................... | H01L 29/0673 |
| 2019/0198645 A1* | 6/2019 | Cheng ............... | H01L 29/66553 |
| 2019/0319095 A1* | 10/2019 | Zhang ................. | H01L 27/1203 |
| 2020/0091145 A1* | 3/2020 | Guha ................. | H01L 29/78696 |
| 2020/0119015 A1* | 4/2020 | Bi ........................ | H01L 21/8221 |

(Continued)

*Primary Examiner* — Sheikh Maruf
(74) *Attorney, Agent, or Firm* — WPAT, P.C.; Anthony King

(57) ABSTRACT

The present disclosure provides a semiconductor structure, including a substrate having a memory region and a logic region, the memory region including a first group of nanosheets vertically arranged over a first region of the substrate, wherein the first group of nanosheets includes: a first semiconductor nanosheet, a second group of nanosheets vertically arranged over a second region of the substrate adjacent to the first region, wherein the second group of nanosheets includes: a second semiconductor nanosheet, and a third semiconductor nanosheet over the second semiconductor nanosheet, a first metal gate layer surrounding the first semiconductor nanosheet, and a second metal gate layer surrounding the second semiconductor nanosheet, wherein the first metal gate layer is in direct contact with the second metal gate layer.

20 Claims, 15 Drawing Sheets

(56) References Cited

U.S. PATENT DOCUMENTS

| | | | |
|---|---|---|---|
| 2020/0144367 A1* | 5/2020 | Tsou | H01L 29/1037 |
| 2020/0287020 A1* | 9/2020 | Seo | H01L 29/775 |
| 2020/0287046 A1* | 9/2020 | Frougier | H01L 29/0673 |
| 2020/0295198 A1* | 9/2020 | Cheng | H01L 29/775 |
| 2020/0402984 A1* | 12/2020 | Reznicek | H01L 29/66833 |
| 2021/0020644 A1* | 1/2021 | Paul | H01L 29/0673 |

\* cited by examiner

MEMORY DEVICE AND METHOD OF FABRICATING THE MEMORY DEVICE

BACKGROUND

Embedded memory is widely used in the semiconductor industry to improve performance of an integrated circuit. For example, non-volatile memory (e.g. flash memory) is often used in memory cards and drives to store data between digital devices.

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. For example, gate-all-around (GAA) technology may enable scaling down process of semiconductor structures, such as memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
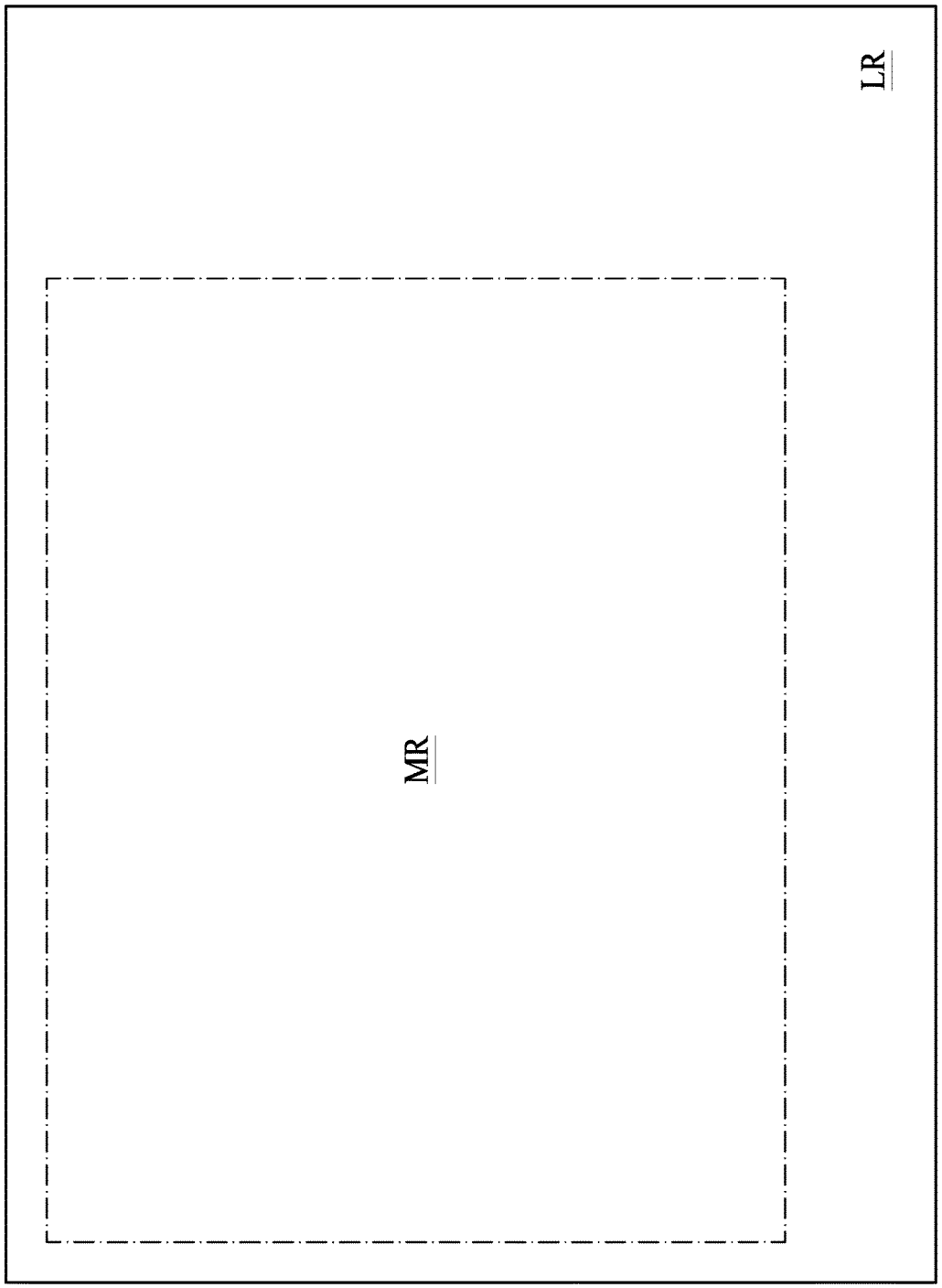
FIG. 1A is a schematic drawing illustrating a top view of a semiconductor structure, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The technology described in this disclosure relates to nanowire-based devices, and more particularly, to nanowire-based fin field-effect transistors (finFETs) and techniques for the fabrication thereof. Gate-all-around (GAA) nanowire channel finFETs may enable future scaling beyond the current complementary-metal-oxide semiconductor (CMOS) technology. Nanowire channel finFETs may also be of interest due to their electrostatic properties, which may be improved in comparison to those of conventional finFETs. Nanowires can have, for example, the shape of a bar (e.g., nanobar), a pillar, or a nanosheet. It should be noted that the present disclosure provides nanosheet having an elliptical cross section as an example, but the shape of nanowires can be adjusted in accordance with design rules.

The term "vertical", as used herein, means nominally perpendicular to the surface of a substrate. The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In a comparative embodiment, a $SiO_2$—SiN—$SiO_2$ (ONO) layer can be utilized as a charge storage/trapping layer for a memory device, e.g. in a NOR flash memory, flash memories, or the like, in a planar memory device architecture. Concerning a 3D stack nanosheets/nanowires memory device architecture, however, ONO layer has a multi-layer structure normally with a minimum thickness of about 10 nm, while a vertical spacing between adjacent nanosheets/nanowires may not be wide enough to accommodate the ONO layer having such thickness. Accordingly, the thickness of the ONO layer may limit its adaptability for being utilized in nanosheet-based or nanowire-based devices, thereby limiting the potential of scaling down device size and fabricating memory devices using nanosheet-based or nanowire-based devices. The present disclosure provides a semiconductor structure and a method of fabricating a semiconductor structure for implementing a memory device, for example, a NOR flash device, on a nanosheet-based or nanowire-based structure.

Figure 1B:
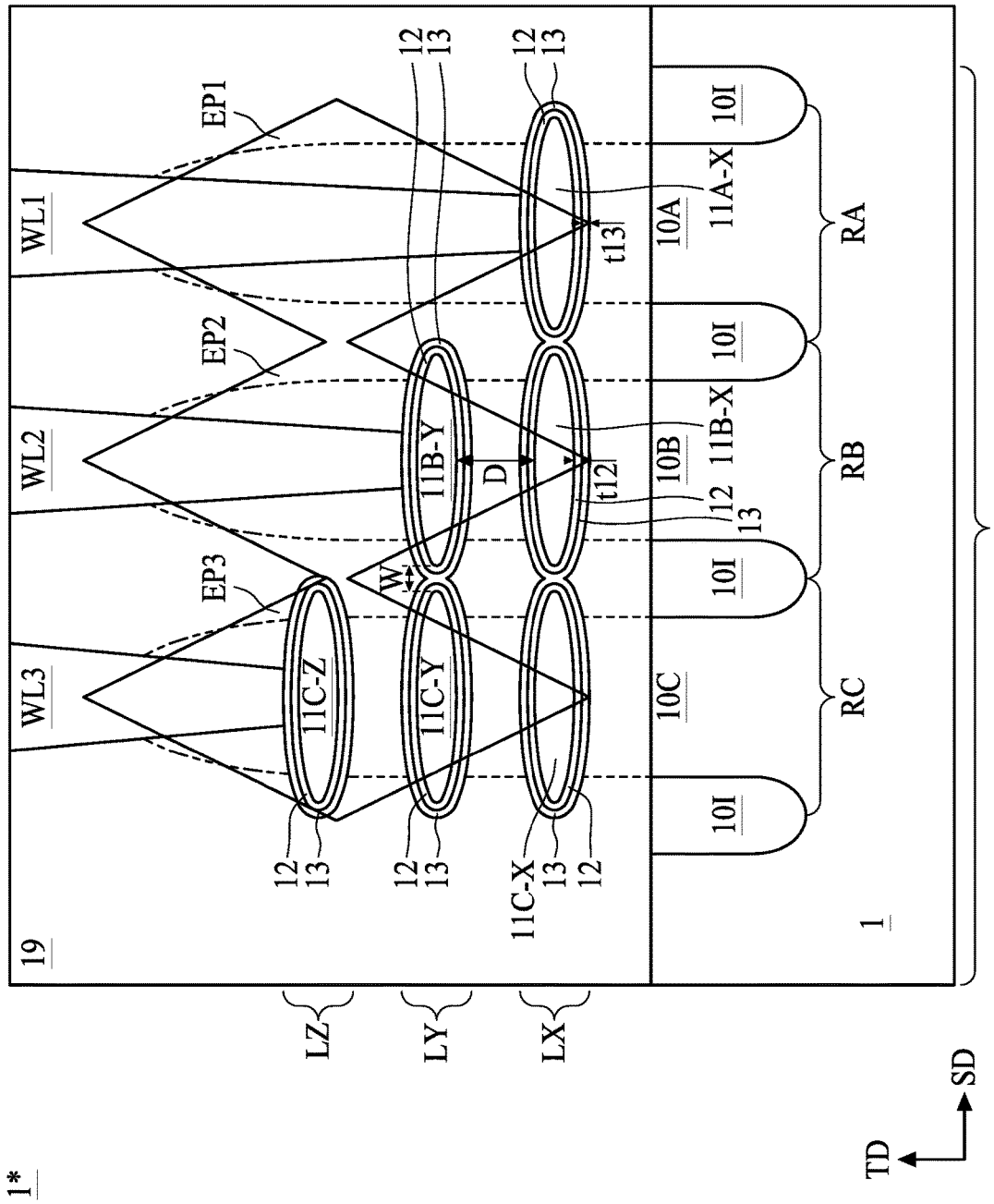
FIG. 1B is a schematic drawing illustrating a cross sectional view of a semiconductor structure, according to some embodiments of the present disclosure.
Figure 1C:
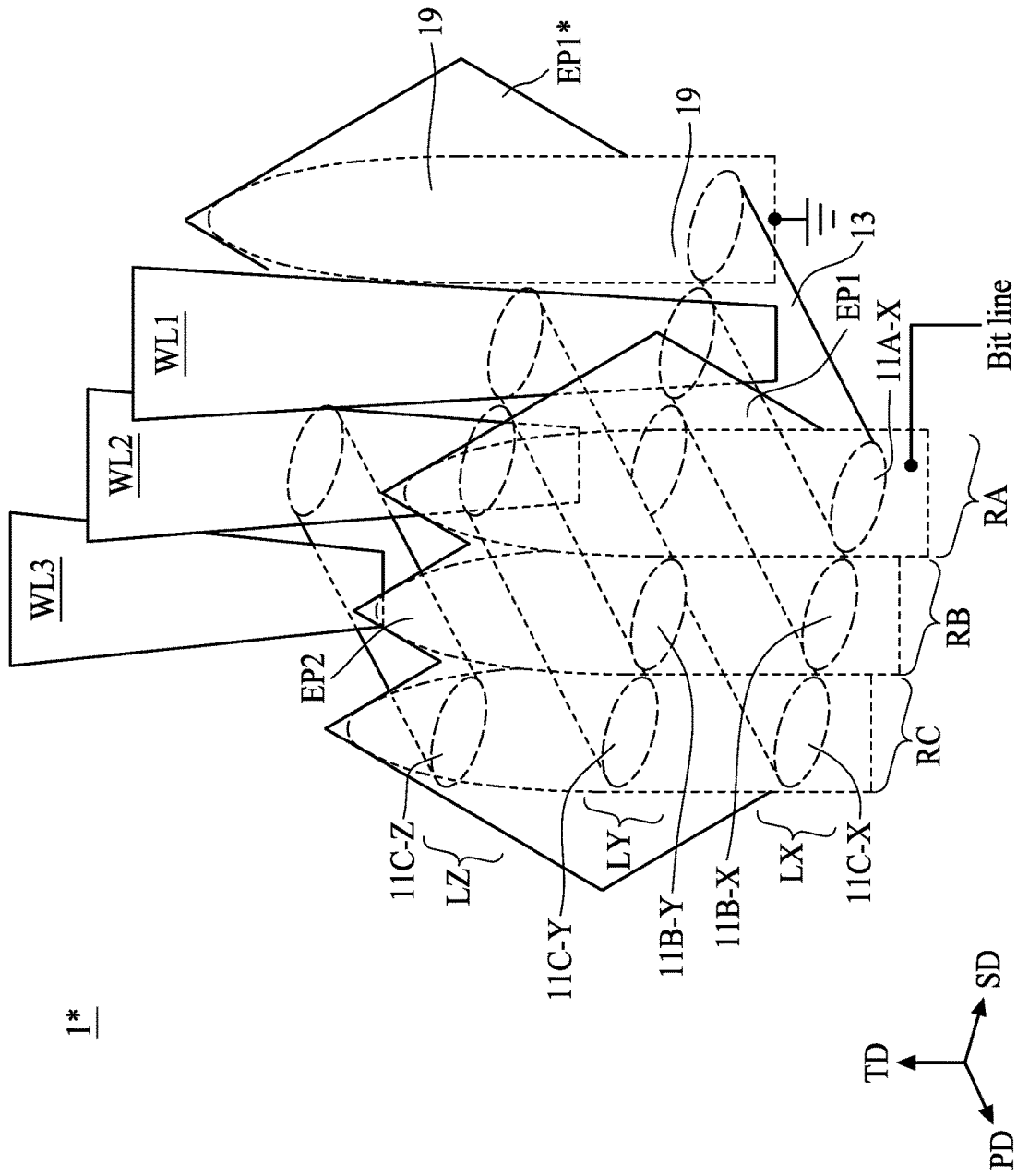
FIG. 1C is a schematic drawing illustrating a perspective view of a semiconductor structure, according to some embodiments of the present disclosure.

Referring to FIG. 1A, FIG. 1B and FIG. 1C, FIG. 1A is a schematic drawing illustrating a top view of a semiconductor structure, FIG. 1B is a schematic drawing illustrating a cross sectional view of a semiconductor structure, FIG. 1C is a schematic drawing illustrating a perspective view of a semiconductor structure, according to some embodiments of the present disclosure. A semiconductor structure 1* includes a substrate 1 having a memory region MR and a logic region LR adjacent to the memory region MR. Optionally, the memory region MR is surrounded by the logic region LR. The semiconductor structure 1* further includes a plurality of groups of nanosheets in the memory region MR. For example, the semiconductor structure 1* at least includes a first group of nanosheets (for example, 11A-1 to 11A-N) and a second group of nanosheets (for example, 11B-1 to 11B-N), wherein N is a positive integer number, and the number following the hyphen in the numerical labels is referred to the vertical level of each nanosheet. Nanosheet labeled with smaller number is closer to the substrate 1 than the ones labeled with larger numbers. In one embodiment as exemplified in FIG. 1B, a first group of nanosheet in the first region RA may include one nanosheet 11A-X in proximity to the substrate 1. In some embodiments, each of the semiconductor nanosheets is composed of element semiconductor or compound semiconductor.

In the example provided in FIG. 1B to FIG. 1C, the semiconductor structure 1* includes three groups of nanosheets, wherein the first group of nanosheets is in a first region RA and includes a first semiconductor nanosheet 11A-X; the second group of nanosheets is in a second region RB and includes a second semiconductor nanosheet 11B-X and a third semiconductor nanosheet 11B-Y; the third group of nanosheets is in a third region RC and includes a fourth semiconductor nanosheet 11C-X, a fifth semiconductor nanosheet 11C-Y, and a sixth semiconductor nanosheet 11C-Z. Each of the semiconductor nanosheet extends along a primary direction PD, and each group of nanosheet includes one or more nanosheets vertically arranged along a tertiary direction TD. Each region (such as the first region RA, the second region RB and the third region RC) is sequentially arranged along a secondary direction SD. The secondary direction SD is substantially perpendicular to the primary direction PD and the tertiary direction TD. In some embodiments, the first region RA further includes a first fin 10A under the first group of nanosheets, the second region RB further includes a second fin 10B under the second group of nanosheets, and the third region RC further includes a third fin 10C under the third group of nanosheets. The first fin 10A is adjacent to the second fin 10B, and the third fin 10C is adjacent to the second fin 10B. Optionally, each of the fins 10A, 10B, 10C are separated by isolation regions 10I.

In the aforesaid example, the first semiconductor nanosheet 11A-X, the second semiconductor nanosheet 11B-X and the fourth semiconductor nanosheet 11C-X are at a first level LX; the third semiconductor nanosheet 11B-Y and the fifth semiconductor nanosheet 11C-Y are at a second level LY above the first level LX; the sixth semiconductor nanosheet 11C-Z is at a third level LZ above the second level LY. Each of the X, Y, Z may be a positive integer, wherein X<Y<Z. For the example provided in FIG. 1B to FIG. 1C, X=1, Y=2, Z=3, but the present disclosure is not limited thereto. X, Y, Z may optionally be other set of numbers.

However, it should be noted that the number of groups of nanosheets and number of semiconductor nanosheets in each region can be varied based on requirement or design rules, such as having any positive number of semiconductor nanosheets in one region and/or having two or more groups of nanosheets in the semiconductor structure 1*. It should also be noted that the term "corresponding nanosheets" or "corresponding semiconductor nanosheets" refers to the nanosheets/semiconductor nanosheets arranged at the same level (which is labeled with a same number/alphabet after the hyphen) and in the adjacent regions. For example, the second semiconductor nanosheet 11B-X in the second region RB is corresponding to the first semiconductor nanosheet 11A-X in the first region RA; the fifth semiconductor nanosheet 11C-Y in the third region RC is corresponding to the third semiconductor nanosheet 11B-Y in the second region RB.

In some embodiments, a total number of semiconductor nanosheets at the first level LX is greater than a total number of semiconductor nanosheets at the second level LY, and a total number of semiconductor nanosheets at the second level LY is greater than a total number of semiconductor nanosheets at the third level LZ.

Figure 1D:
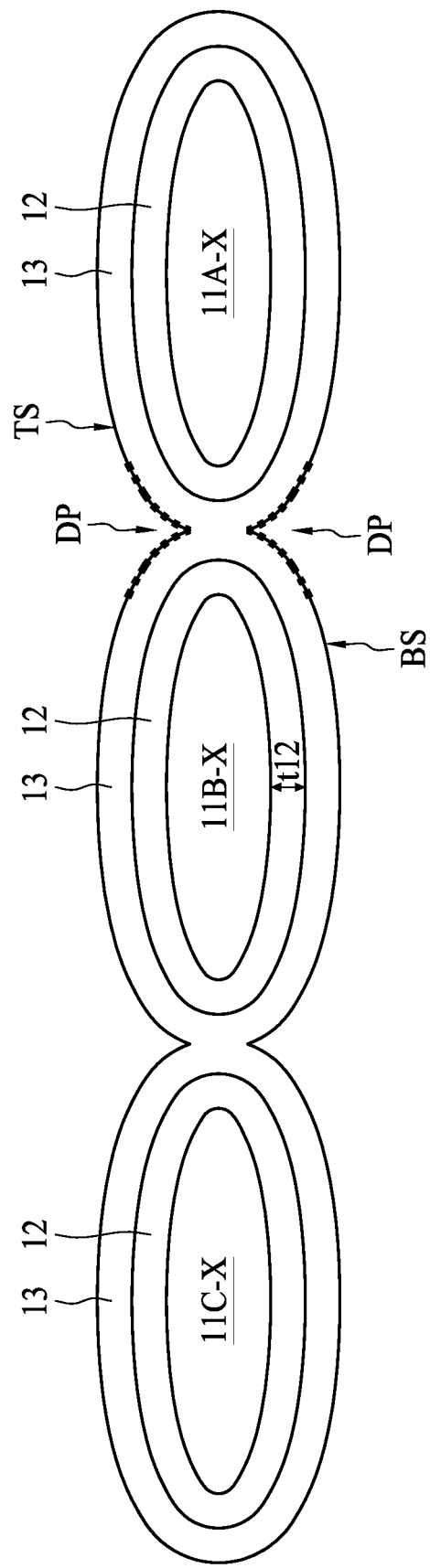
FIG. 1D is an enlarged schematic drawing illustrating a cross sectional view of corresponding nanosheets in adjacent regions, according to some embodiments of the present disclosure.

Referring to FIG. 1B, FIG. 1C and FIG. 1D, FIG. 1D is an enlarged schematic drawing illustrating a cross sectional view of corresponding nanosheets in adjacent regions, according to some embodiments of the present disclosure. Each of the semiconductor nanosheets are surrounded by a ferroelectric layer 12, wherein a thickness t12 of the ferroelectric layer is less than 5 nm. In some embodiments, the ferroelectric layer 12 may include ferroelectric materials, such as hafnium oxide-based material. In some embodiments, the hafnium oxide-based material is doped with zirconium or silicon and can be represented in a compound formula $HfZrO_x$ or $HfSiO_x$. The ferroelectric layer 12 has the ability to store charge. Each of the ferroelectric layer 12 surrounding the first semiconductor nanosheet 11A-X, the second semiconductor nanosheet 11B-X, the fourth semiconductor nanosheet 11C-X are separated from each other. For example, the ferroelectric layer 12 surrounding the first semiconductor nanosheet 11A-X is physically separated from the ferroelectric layer 12 surrounding the second semiconductor nanosheet 11B-X by a metal gate layer 13, and the ferroelectric layer 12 surrounding the second semiconductor nanosheet 11B-X is physically separated from the ferroelectric layer 12 surrounding the third semiconductor nanosheet 11B-Y by a metal gate layer 13.

Each of the ferroelectric layer 12 surrounding the first semiconductor nanosheet 11A-X, the second semiconductor nanosheet 11B-X, the fourth semiconductor nanosheet 11C-X is surrounded by a metal gate layer 13. The metal gate layer 13 includes conductive material, such as titanium nitride (TiN), tantalum nitride (TaN), tungsten (W), or the like. In some embodiments, a thickness t13 of the metal gate layer 13 is about 5 nm. A plurality of metal gate layers 13 surrounding semiconductor nanosheets at the same level are in direct contact to each other. In the example provided in FIG. 1B, the metal gate layer 13 surrounding the second semiconductor nanosheet 11B-X is in direct contact with the metal gate layer 13 surrounding the first semiconductor nanosheet 11A-X and the metal gate layer 13 surrounding the fourth semiconductor nanosheet 11C-X. The metal gate layer 13 surrounding the third semiconductor nanosheet 11B-Y is in direct contact with the metal gate layer 13 surrounding the fifth semiconductor nanosheet 11C-Y.

The top surfaces of each connected metal gate layers 13 constitute a continuous top surface TS, and the bottom surfaces of each connected metal gate layers 13 constitute a continuous bottom surface BS. For example, the top surface of the metal gate layer 13 surrounding the first semiconductor nanosheet 11A-X, the top surface of the metal gate layer 13 surrounding the second semiconductor nanosheet 11B-X, and the top surface of the metal gate layer 13 surrounding the fourth semiconductor nanosheet 11C-X are continuously connected. The bottom surface of the metal gate layer 13 surrounding the first semiconductor nanosheet 11A-X, the bottom surface of the metal gate layer 13 surrounding the second semiconductor nanosheet 11B-X, and the bottom surface of the metal gate layer 13 surrounding the fourth semiconductor nanosheet 11C-X are continuously connected. Similar configuration may be applied to the nanosheets at other levels, for example, applied to the third semiconductor nanosheet 11B-Y and the fifth semiconductor nanosheet 11C-Y at the second level L2.

The continuous top surface TS includes a dimple DP at a position between two corresponding semiconductor nanosheets, recessing toward the substrate 1. The continuous bottom surface BS includes a dimple DP at a position between two corresponding semiconductor nanosheets, recessing away from the substrate 1. Alternatively stated, a thickness of the metal gate layer 13 at a position between two corresponding semiconductor nanosheets is less than a total thickness of a semiconductor nanosheet, a ferroelectric layer 12 (including the portion above the semiconductor nanosheet and the portion below the semiconductor nanosheet) and a metal gate layer 13 (including the portion above the semiconductor nanosheet and the portion below the semiconductor nanosheet) combined.

On the other hand, a metal gate layer 13 surrounding one semiconductor nanosheet is physically and electrically separated from metal gate layer 13 surrounding another semiconductor nanosheet in the same region but at different levels (i.e. the ones vertically above or under). For example, the metal gate layer 13 surrounding the fifth semiconductor nanosheet 11C-Y is physically and electrically separated from the metal gate layer 13 surrounding the fourth semiconductor nanosheet 11C-X and the metal gate layer 13 surrounding the sixth semiconductor nanosheet 11C-Z. The metal gate layer 13 surrounding the second semiconductor nanosheet 11B-X is physically and electrically separated from the metal gate layer 13 surrounding the third semiconductor nanosheet 11B-Y. In some embodiments, an insulation layer 19 can be disposed to be surrounding and interposing between different levels of metal gate layers 13, thereby a top surface of a metal gate layer 13 surrounding a semiconductor nanosheet and a bottom surface of a metal gate layer 13 surrounding another semiconductor nanosheet one level above is spaced away by the insulation layer 19.

As previously discussed, a thickness t12 of ferroelectric layer 12 can be less than a thickness conventionally adopted for an ONO layer. For example, the ferroelectric layer 12 can be formed by atomic layer deposition (ALD) operation and thus the thickness of the ferroelectric layer 12 can be controlled to be less than 5 nm. The thickness of the ferroelectric layer 12 may be substantially uniform. Therefore, this allows the ferroelectric layer 12 to be incorporated into the semiconductor structure 1*, possessing a vertical distance D greater than bout 10 nm between two semiconductor nanosheets in a same region and at adjacent levels. By having vertical distance D greater than 10 nm and thickness t12 being less than 5 nm, a metal gate layer 13 surrounding one semiconductor nanosheet can be physically and electrically separated from metal gate layer 13 surrounding another semiconductor nanosheet in the same region but at different levels (i.e. the ones vertically above or under). On the other hand, a lateral distance W between two adjacent semiconductor nanosheets at the same level (i.e. corresponding semiconductor nanosheets) is less than the vertical distance D. In some embodiments, the lateral distance W is in a range from about 7 nm to about 10 nm, allowing the metal gate layers 13 surrounding corresponding semiconductor nanosheets to be able to be connected.

Referring to FIG. 1B, FIG. 1C, FIG. 1D and FIG. 1E, FIG. 1E is a circuit diagram illustrating the semiconductor structure discussed in FIG. 1B, according to some embodiments of the present disclosure. Each of a first end of a group of the semiconductor nanosheets are connected to one epitaxial feature, and another epitaxial feature is connected to a second end of the group of the semiconductor nanosheets opposite to the first end. In the example provided in FIG. 1C and FIG. 1D, a first end of the first semiconductor nanosheet 11A-X is connected to a first epitaxial feature EP1, a second end of the first semiconductor nanosheet 11A-X opposite to the first end is connected to a second epitaxial feature EP1*. A first end of each of the second semiconductor nanosheet 11B-X and the third semiconductor nanosheet 11B-Y is connected to a third epitaxial feature EP2, a second end of each of the second semiconductor nanosheet 11B-X and the third semiconductor nanosheet 11B-Y opposite to the first end is connected to a fourth epitaxial feature EP2*. A first end of each of the fourth semiconductor nanosheet 11C-X, the fifth semiconductor nanosheet 11C-Y and the sixth semiconductor nanosheet 11C-Z is connected to a fifth epitaxial feature EP3, a second end of each of the fourth semiconductor nanosheet 11C-X, the fifth semiconductor nanosheet 11C-Y and the sixth semiconductor nanosheet 11C-Z opposite to the first end is connected to a sixth epitaxial feature EP3*. In some embodiments, the epitaxial features may include SiP, SiGe, or other suitable source/drain material.

Each of the epitaxial features connected to the first end of the semiconductor nanosheets are connected, and each of the epitaxial features connected to the second end of the semiconductor nanosheets are connected. For example, the first epitaxial feature EP1, the third epitaxial feature EP2 and the fifth epitaxial feature EP3 are electrically and/or physically connected. The second epitaxial feature EP1*, the fourth epitaxial feature EP2* and the sixth epitaxial feature EP3* are electrically and/or physically connected. Herein the first epitaxial feature EP1, the third epitaxial feature EP2 and the fifth epitaxial feature EP3 are collectively referred to as a first group of epitaxial features, and the second epitaxial feature EP1*, the fourth epitaxial feature EP2* and the sixth epitaxial feature EP3* are collectively referred to as a second group of epitaxial features. The first group of epitaxial features may be connected to a bit line or serving as an extension of the bit line in the memory device 1*. The second group of epitaxial features may be connected to a ground potential.

Figure 1E:
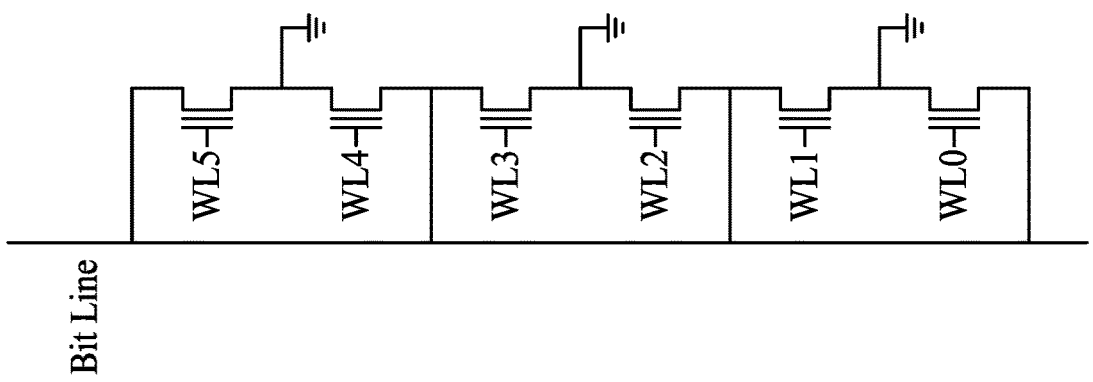
FIG. 1E is a circuit diagram illustrating the semiconductor structure discussed in FIG. 1B, according to some embodiments of the present disclosure.

A first conductive via WL1 is connected to the metal gate layer 13 at the first level LX. For example, the first conductive via WL1 is in direct contact with a top surface of connected metal gate layers 13 at the first level LX and electrically connected to the semiconductor nanosheets at the first level LX (such as the first semiconductor nanosheet 11A-X, the second semiconductor nanosheet 11B-X and the fourth semiconductor nanosheet 11C-X). A second conductive via WL2 is connected to the metal gate layer 13 at the second level LY. For example, the second conductive via WL2 is in direct contact with a top surface of connected metal gate layers 13 at the second level LY and electrically connected to the semiconductor nanosheets at the second level LY (such as the third semiconductor nanosheet 11B-Y and the fifth semiconductor nanosheet 11C-Y). A third conductive via WL3 is connected to the metal gate layer 13 at the third level LZ. For example, the third conductive via WL3 is in direct contact with a top surface of the metal gate layer 13 at the third level LZ and electrically connected to the semiconductor nanosheets at the third level LZ (such as the sixth semiconductor nanosheet 11C-Z). The first conductive via WL1, the second conductive via WL2 and the third conductive via WL3 may be connected to various word lines or serve as extensions of the word lines in the memory device 1*. In some embodiments, the first conductive via WL1, the second conductive via WL2, and the third conductive via WL3 are connected in parallel, as illustrated in FIG. 1E. For example, the first conductive via WL1 may dictate the amount of charges accumulated in the nanosheets connected between the bit line and the ground potential. In the case of more groups or more layers of semiconductor nanosheets are formed, more conductive vias (e.g. WL0 to WL5 in the example of FIG. 1E) can be implemented. Each of the conductive vias may be surrounded by the insulation layer 19, as illustrated in FIG. 1B.

Figure 2A:
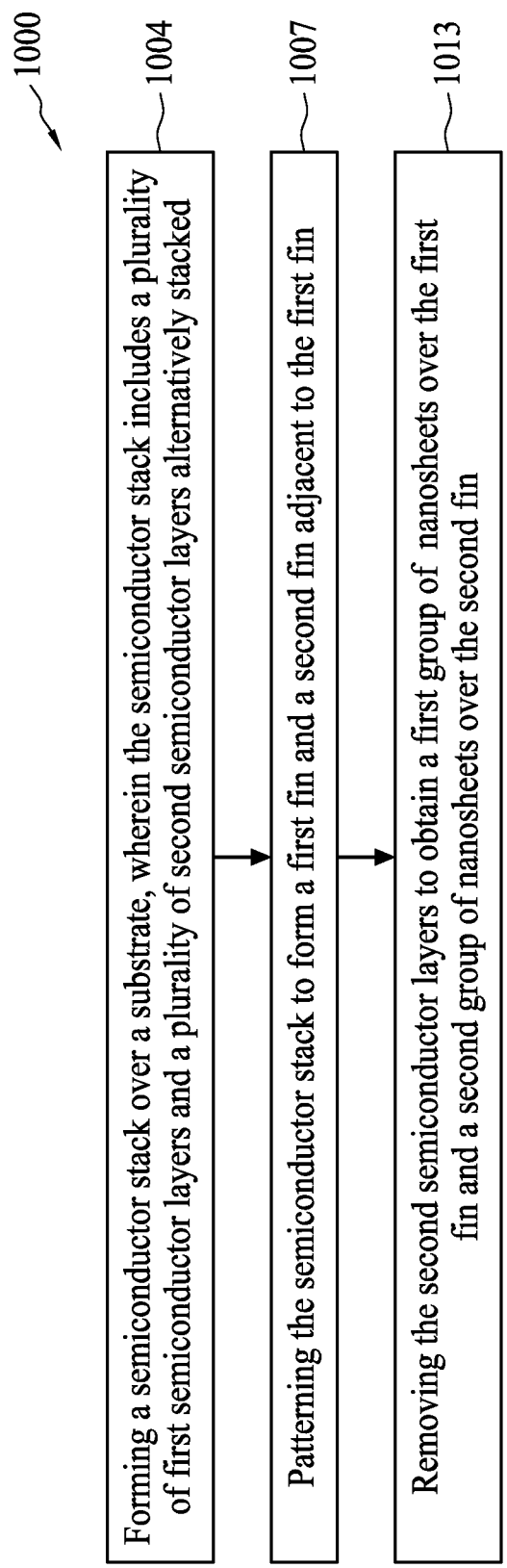
FIG. 2A shows a flow chart representing a method for fabricating a semiconductor structure, in accordance with some embodiments of the present disclosure.

Referring to FIG. 2A, FIG. 2A shows a flow chart representing a method for fabricating a semiconductor structure, in accordance with some embodiments of the present disclosure. The method 1000 for fabricating a semiconductor structure includes forming a semiconductor stack over a substrate, wherein the semiconductor stack, wherein the semiconductor stack includes a plurality of first semiconductor layers and a plurality of second semiconductor layers alternatively stacked (operation 1004, which can be referred to FIG. 3), patterning the semiconductor stack to form a first fin and a second fin adjacent to the first fin (operation 1007, which can be referred to FIG. 4A to FIG. 4B), and removing the second semiconductor layers to obtain a first group of nanosheets over the first fin and a second group of nanosheets over the second fin (operation 1013, which can be referred to FIG. 6).

Figure 2B:
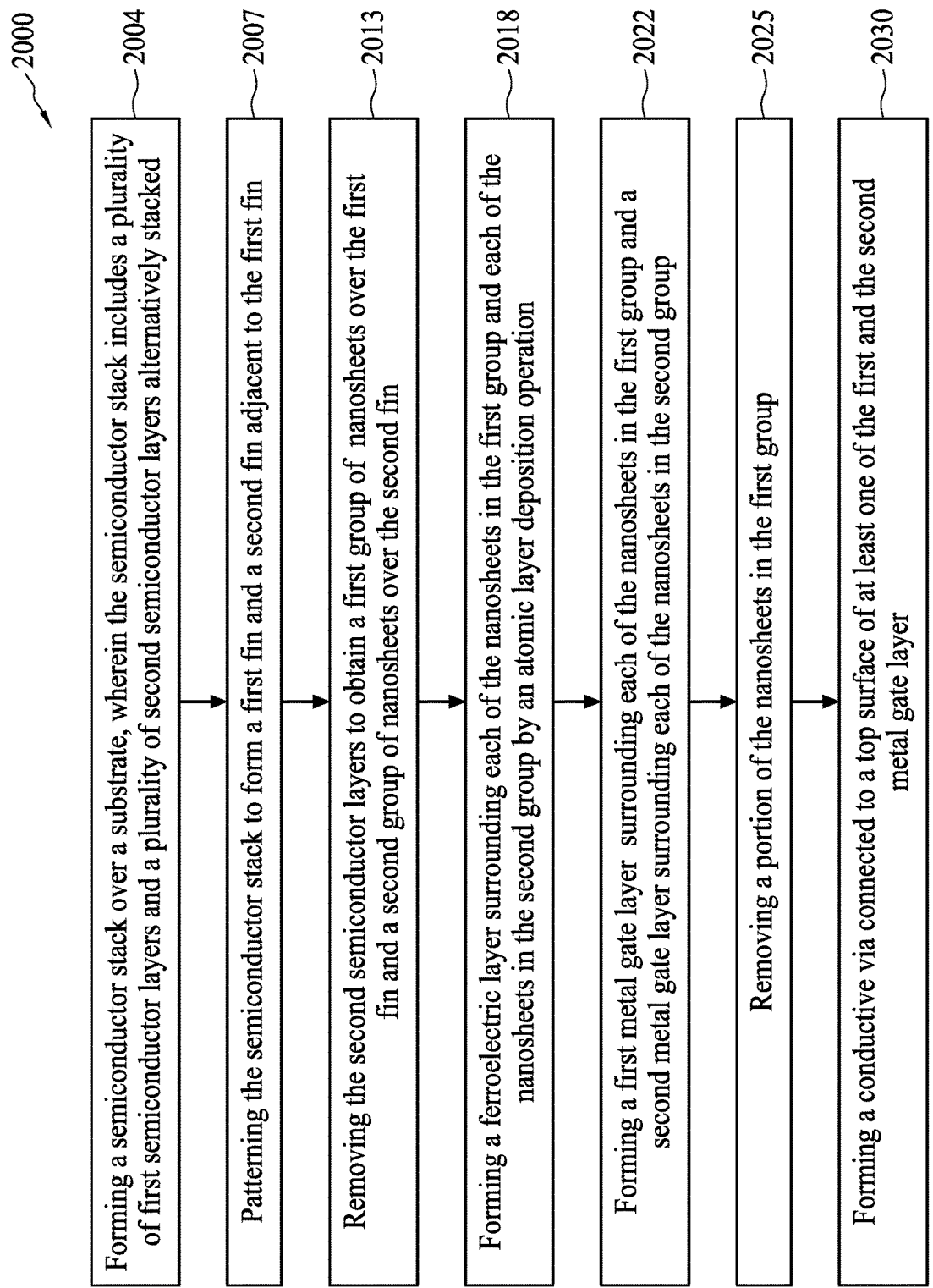
FIG. 2B shows a flow chart representing a method for fabricating a semiconductor structure, in accordance with some embodiments of the present disclosure.

Referring to FIG. 2B, FIG. 2B shows a flow chart representing a method for fabricating a semiconductor structure, in accordance with some embodiments of the present disclosure. The method 2000 for fabricating a semiconductor structure includes forming a semiconductor stack over a substrate, wherein the semiconductor stack includes a plurality of first semiconductor layers and a plurality of second semiconductor layers alternatively stacked (operation 2004, which can be referred to FIG. 3), patterning the semiconductor stack to form a first fin and a second fin adjacent to the first fin (operation 2007, which can be referred to FIG. 4A to FIG. 4B), removing the second semiconductor layers to obtain a first group of nanosheets over the first fin and a second group of nanosheets over the second fin (operation 2013, which can be referred to FIG. 6), forming a ferroelectric layer surrounding each of the nanosheets in the first group and each of the nanosheets in the second group by an atomic layer deposition operation (operation 2018, which can be referred to FIG. 7), forming a first metal gate layer surrounding each of the nanosheets in the first group and a second metal gate layer surrounding each of the nanosheets in the second group (operation 2022, which can be referred to FIG. 8), removing a portion of the nanosheets in the first group (operation 2025, which can be referred to FIG. 9), forming a conductive via connected to a top surface of at least one of the first and the second metal gate layer (operation 2030, which can be referred to FIG. 9).

Figure 3:
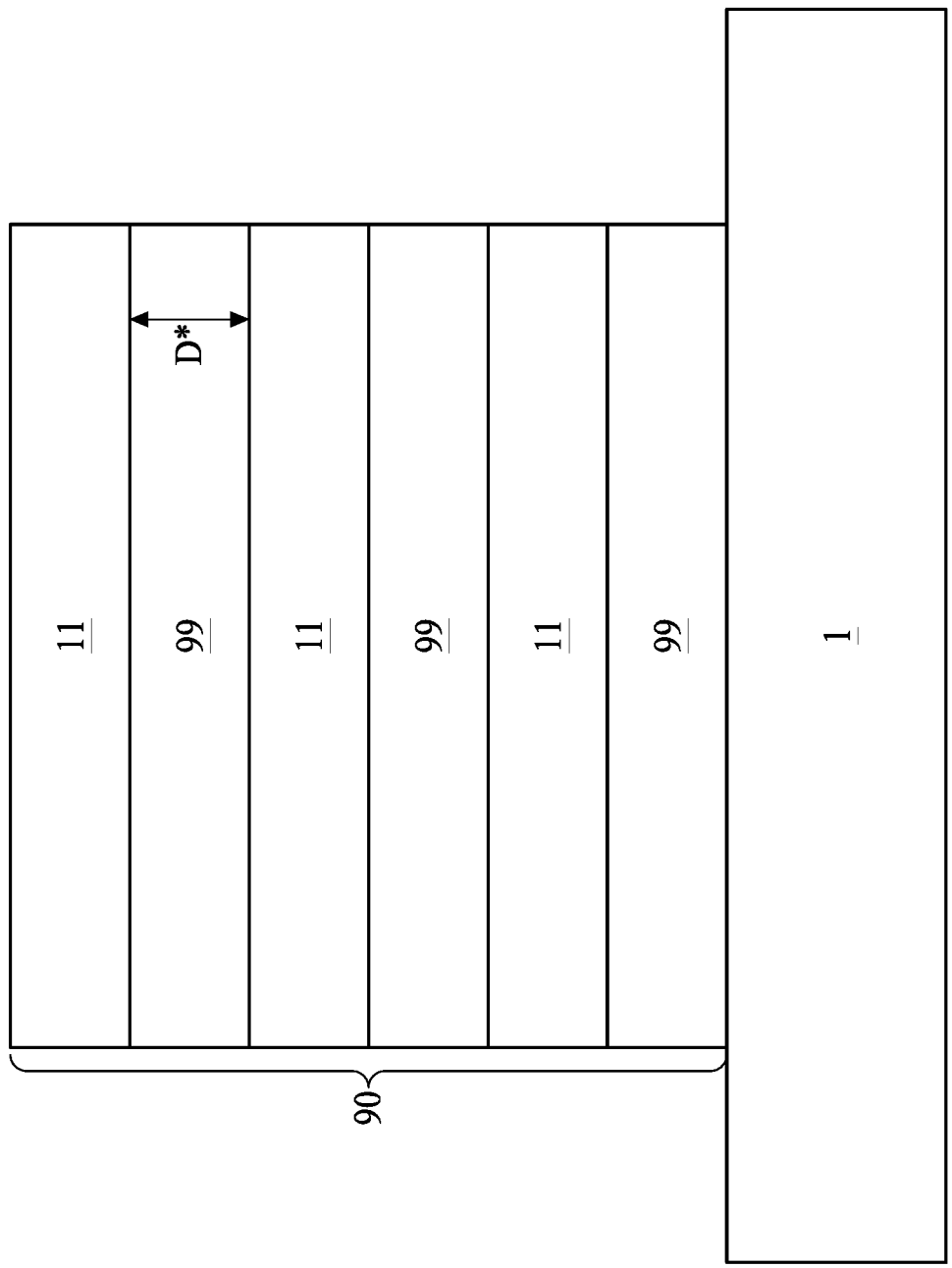
FIG. 3 is a cross sectional view of a semiconductor structure during intermediate stages of manufacturing operations, according to some embodiments of the present disclosure.

Referring to FIG. 1A and FIG. 3, FIG. 3 is a cross sectional view of a semiconductor structure during intermediate stages of manufacturing operations, according to some embodiments of the present disclosure. A semiconductor stack 90 is formed on the substrate 1, wherein the semiconductor stack 90 includes a plurality of first semiconductor layers 11 and a plurality of second semiconductor layers 99 alternatively stacked. In some embodiments, the first semiconductor layers 11 includes silicon or silicon compounds, the second semiconductor layers 99 includes a material different from the first semiconductor layers 11, such as silicon germanium or other suitable sacrificial material. Each of the second semiconductor layers 99 has a thickness D*. In some embodiments, thickness D* is greater than 10 nm. In some embodiments, the semiconductor stack 90 is formed in the memory region MR and the logic region LR.

Figure 4A:
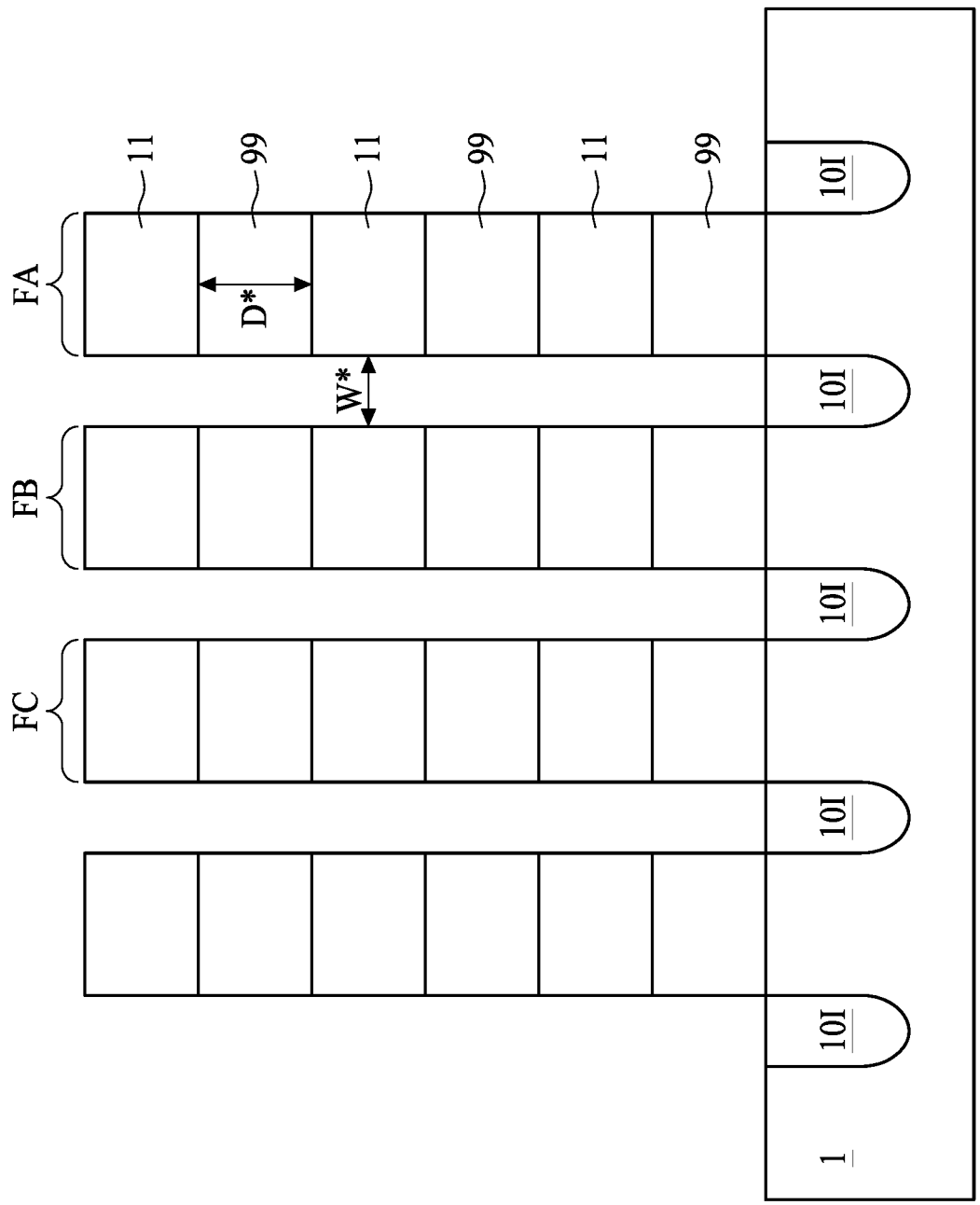
FIG. 4A is a cross sectional view of a semiconductor structure during intermediate stages of manufacturing operations, according to some embodiments of the present disclosure.
Figure 4B:
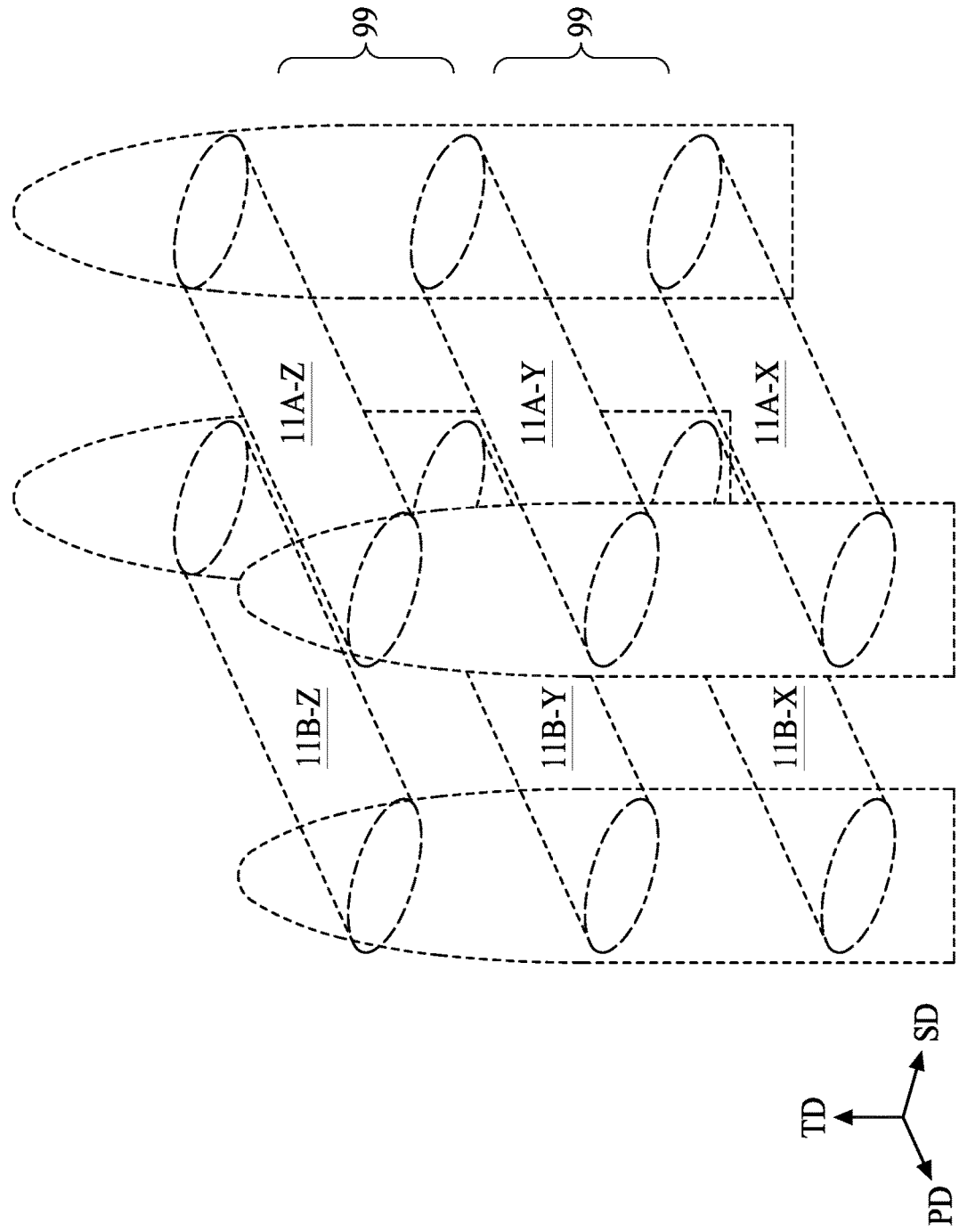
FIG. 4B is a perspective sectional view of a semiconductor structure during intermediate stages of manufacturing operations, according to some embodiments of the present disclosure.

Referring to FIG. 4A and FIG. 4B, FIG. 4A is a cross sectional view of a semiconductor structure during intermediate stages of manufacturing operations, FIG. 4B is a perspective sectional view of a semiconductor structure during intermediate stages of manufacturing operations, according to some embodiments of the present disclosure. At least a portion of the semiconductor stack 90 in the memory region MR is patterned to form a plurality of fin structures, for example, at least include a first fin structure FA and a second fin structure FB. It should be noted that the number of fin structure formed is not limited in the present disclosure. (such as further include a third fin structure FC, et cetera) A pitch W* between the first fin structure FA and the second fin structure FB is less than the thickness D*. Optionally, a portion of the semiconductor stack 90 in the logic region LR can be patterned simultaneously with a same mask, thereby reducing the operation time of patterning the semiconductor stack 90 in the memory region MR and the logic region LR. Optionally, a lateral pitch between the fins in the logic region LR can be greater than W*, while the remaining second semiconductor layers 99 of the semiconductor stack 90 in the logic region LR is substantially identical to thickness D*.

Isolation regions 10I may be formed between the fin structures (e.g. FA, FB). In some embodiments, a dielectric layer (not shown in FIG. 4A or FIG. 4B) is formed over the fin structures and planarized, and subsequently etched back to form the isolation regions 10I. In some embodiments, the isolation regions 10I may be a shallow trench isolation.

Figure 5:
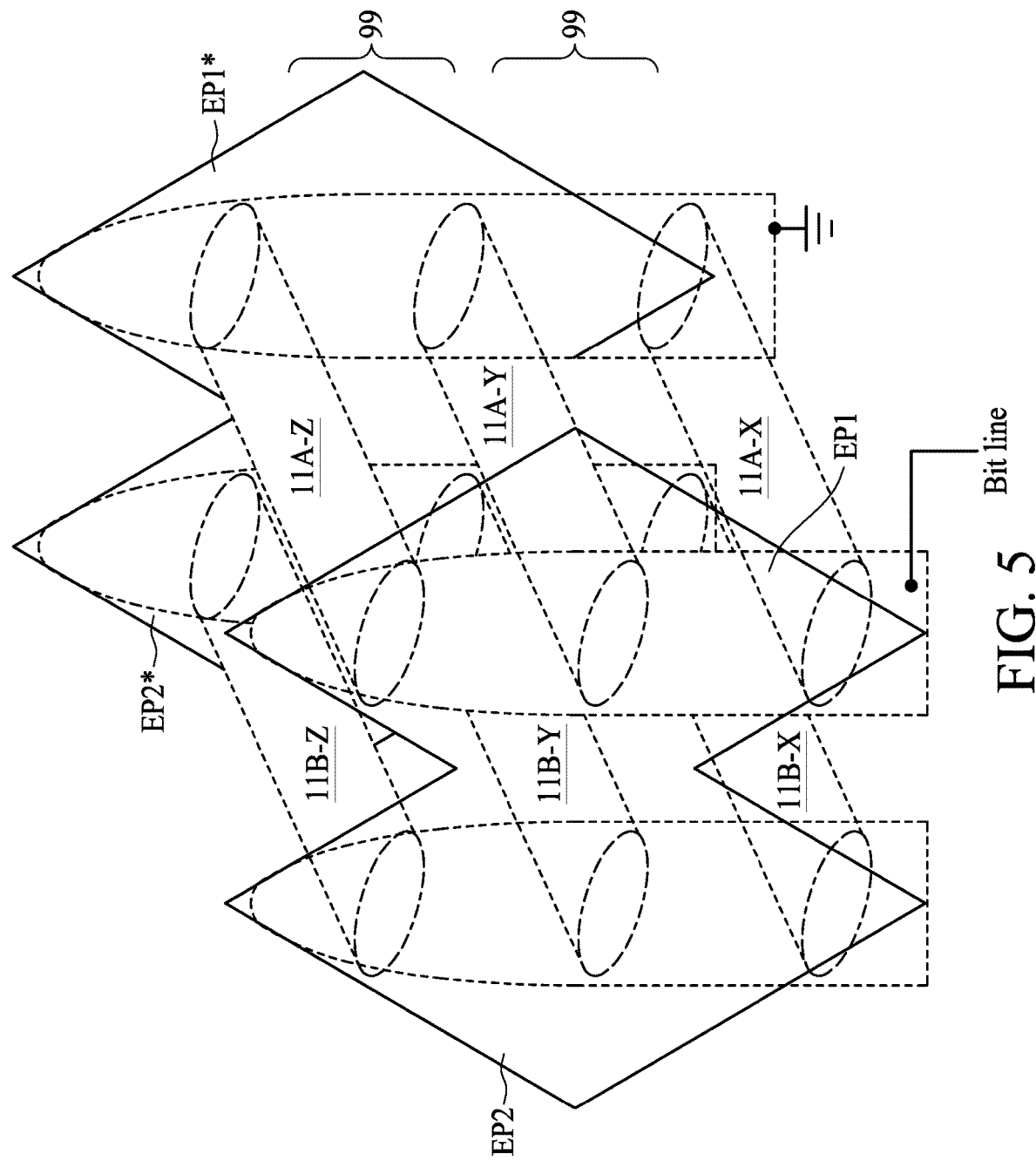
FIG. 5 to FIG. 9 are cross sectional views of a semiconductor structure during intermediate stages of manufacturing operations, according to some embodiments of the present disclosure.

Referring to FIG. 5, FIG. 5 is a cross sectional view of a semiconductor structure during intermediate stages of manufacturing operations, according to some embodiments of the present disclosure. A first group of the epitaxial features is formed on a side of the fin structures and a second group of epitaxial features is formed on another side of the fin structures. For example, the first fin structure FA has a first side connected to a first epitaxial feature EP1 of the first group of the epitaxial features, and has a second side connected to a second epitaxial feature EP1* of the second group of the epitaxial features. The second fin structure FB has a first side connected to a third epitaxial feature EP2 of the first group of the epitaxial features, and has a second side connected to a fourth epitaxial feature EP2* of the second group of the epitaxial features. Similarly, the third fin structure FC (if presented) has a first side connected to a fifth epitaxial feature EP3 of the first group of the epitaxial features (shown in FIG. 1C), and has a second side connected to a sixth epitaxial feature EP3* of the second group of the epitaxial features. (shown in FIG. 1C). In some embodiments, the epitaxial features may include SiP, SiGe, or other suitable material that can be utilized as a source/drain material. Each of the first group of epitaxial features are electrically and/or physically connected, and each of the second group of epitaxial features are electrically and/or physically connected. The first group of epitaxial features is connected to a bit line or serving as an extension of the bit line in the memory device 1*, while the second group is connected to ground potential.

Figure 6:
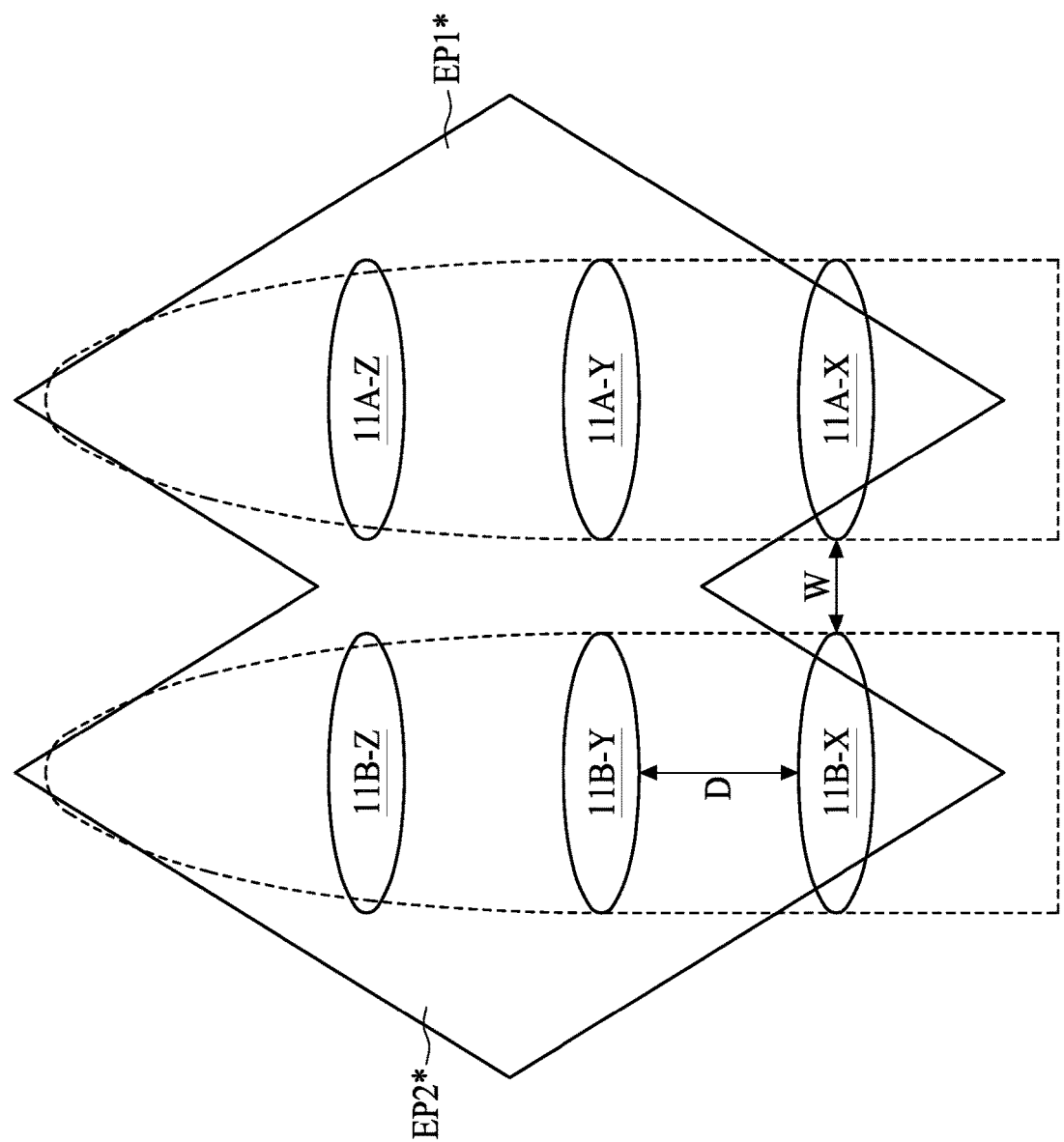

Referring to FIG. 6, FIG. 6 is a cross sectional view of a semiconductor structure during intermediate stages of manufacturing operations, according to some embodiments of the present disclosure. The second semiconductor layers 99 is removed from the fin structures to at least obtain a first group of semiconductor nanosheets in the first region RA (in the example provided in FIG. 6, including 11A-X, 11A-Y and 11A-Z), and a second group of semiconductor nanosheets in the second region RB (in the example provided in FIG. 6, including 11B-X, 11B-Y and 11B-Z). It should be noted that more than two groups of semiconductor nanosheets can be formed, such as further forming a third group of semiconductor nanosheets in the third region RC, et cetera. The number of groups of semiconductor nanosheets formed herein is not limited in the present disclosure.

After removing the second semiconductor layers 99, a vertical distance D is between the semiconductor nanosheets in the same region (such as between two semiconductor nanosheets 11B-X, 11B-Y), wherein the vertical distance D is greater than 10 nm. A lateral distance W between corresponding semiconductor nanosheets (i.e. two semiconductor nanosheets in adjacent regions and at a same level, such as semiconductor nanosheets 11A-X and 11B-X) is less than the vertical distance D. In some embodiments, the lateral distance W is in a range from about 7 nm to about 10 nm.

Figure 7:
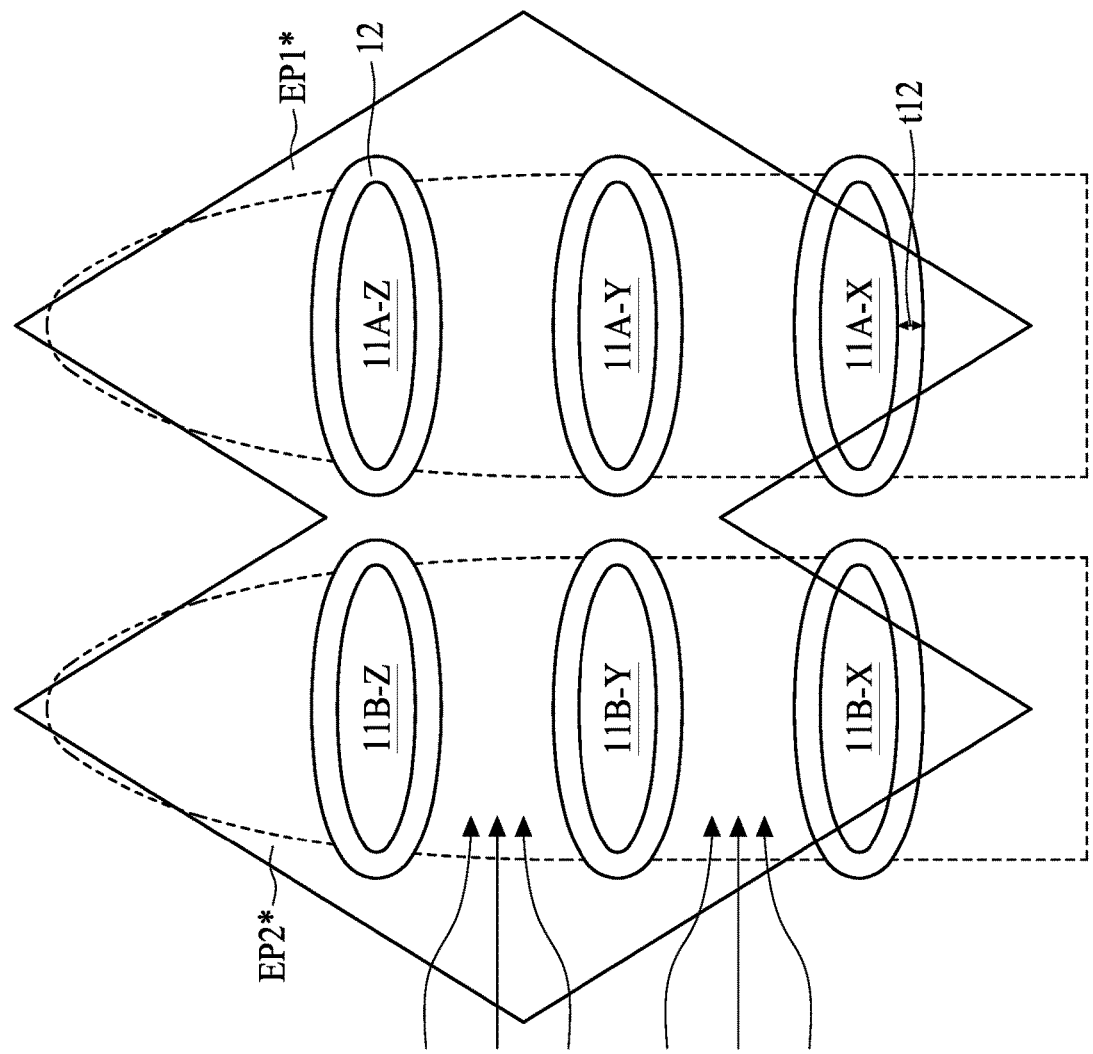

Referring to FIG. 7, FIG. 7 is a cross sectional view of a semiconductor structure during intermediate stages of manufacturing operations, according to some embodiments of the present disclosure. The ferroelectric layer 12 is formed to surround each semiconductor nanosheets. In some embodiments, a thickness t12 of the ferroelectric layer 12 is less than 5 nm. In order to form the ferroelectric layer 12 less than 5 nm, a deposition operation allowing a more precise thickness control is performed, for example, atomic layer deposition (ALD). The ferroelectric layer 12 may conform to a shape of each of the semiconductor nanosheets. In some embodiments, the ferroelectric layer 12 may include ferroelectric materials, such as hafnium oxide-based material. In some embodiments, an in-situ doping operation is performed, so the ferroelectric layer 12 can be doped in order to enhance the device performance. For the example of the ferroelectric layer 12 including the hafnium oxide-based material, the hafnium oxide-based material can be doped with zirconium or silicon to become $HfZrO_x$ or $HfSiO_x$. It should be noted that each of the ferroelectric layer 12 are physically separated from each other.

Figure 8:
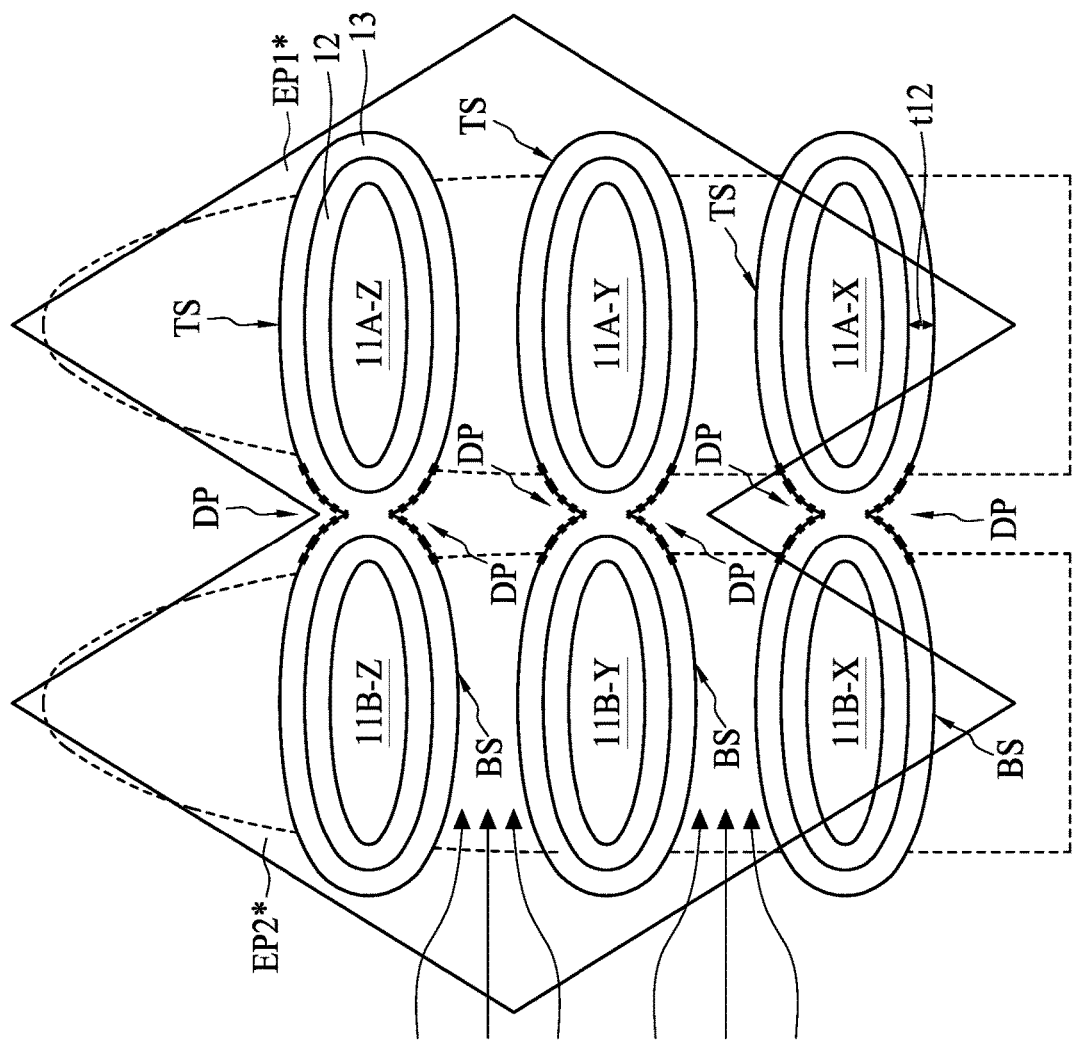

Referring to FIG. 8, FIG. 8 is a cross sectional view of a semiconductor structure during intermediate stages of manufacturing operations, according to some embodiments of the present disclosure. The metal gate layer 13 is formed to surround each of the ferroelectric layers 12 and each of the semiconductor nanosheets. In some embodiments, a thickness t13 of the metal gate layer 13 is about 5 nm. In order to form the metal gate layer 13 having a thickness about 5 nm, a deposition operation allowing a more precise thickness control is performed, for example, atomic layer deposition (ALD). In some embodiments, the metal gate layer 13 includes conductive material, such as titanium nitride (TiN), tantalum nitride (TaN), tungsten (W), or the like. A plurality of metal gate layers 13 surrounding semiconductor nanosheets at the same level are in direct contact. In the example provided in FIG. 8, the metal gate layer 13 surrounding the semiconductor nanosheet 11A-X is in direct contact with the metal gate layer 13 surrounding the semiconductor nanosheet 11B-X. The metal gate layer 13 surrounding the semiconductor nanosheet 11A-Y is in direct contact with the metal gate layer 13 surrounding the semiconductor nanosheet 11B-Y. On the other hand, a metal gate layer 13 surrounding one semiconductor nanosheet is physically and electrically separated from metal gate layer 13 surrounding another semiconductor nanosheet in the same region but at different levels (i.e. the ones vertically above or under).

In some embodiments, one of the features of utilizing ALD operation to form the metal gate layers 13 is that the metal gate layers 13 may be conformed to the shape of the ferroelectric layers 12. The top surfaces of each connected metal gate layers 13 constitute a continuous top surface TS, and the bottom surfaces of each connected metal gate layers 13 constitute a continuous bottom surface BS. The continuous top surface TS includes a dimple DP at a position between the corresponding semiconductor nanosheets, recessing toward the substrate 1. The continuous bottom surface BS includes a dimple DP at a position between the corresponding semiconductor nanosheets, recessing away from the substrate 1.

Figure 9:
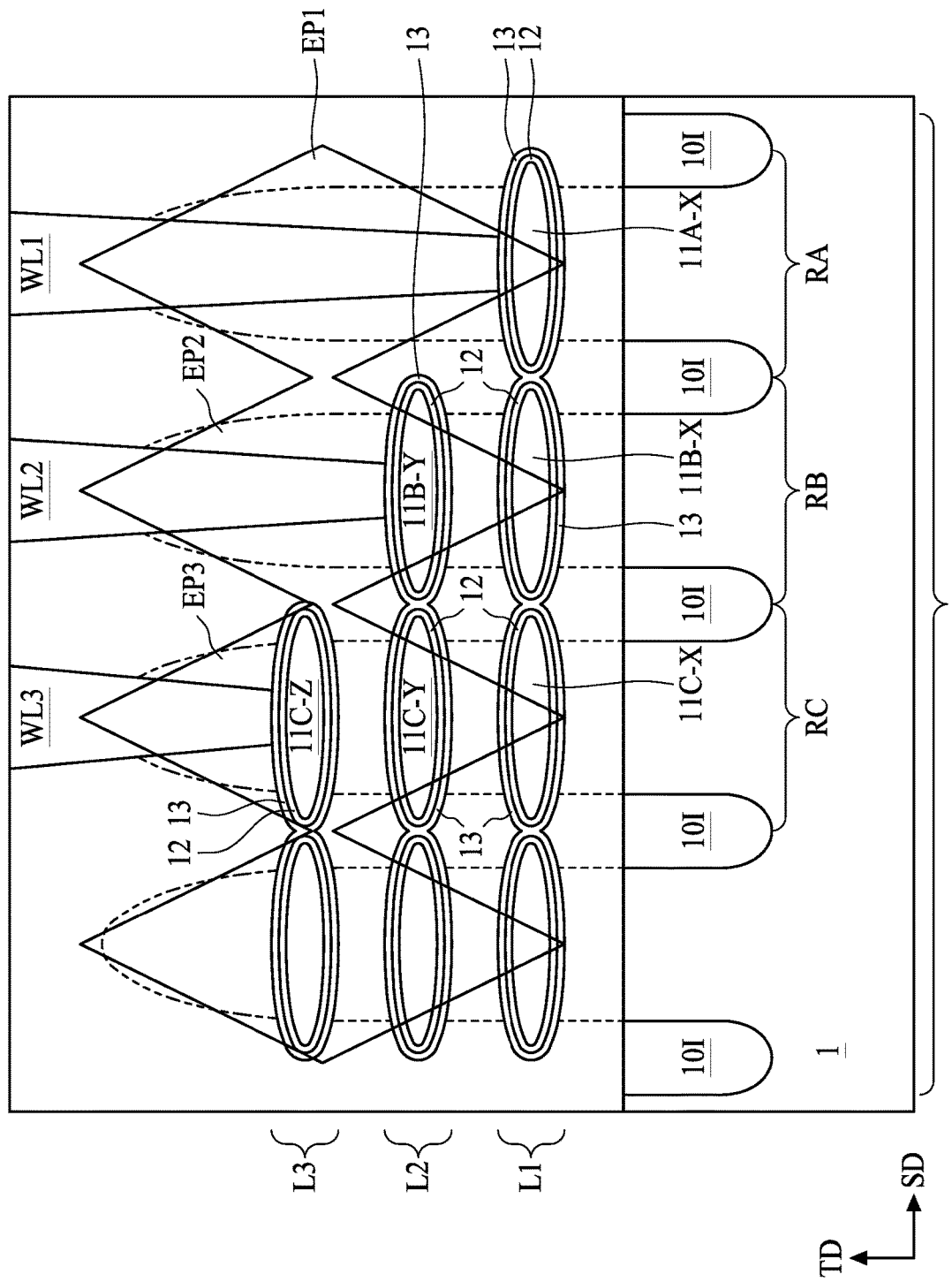

Referring to FIG. 9, FIG. 9 is a cross sectional view of a semiconductor structure during intermediate stages of manufacturing operations, according to some embodiments of the present disclosure. At least a portion of semiconductor nanosheets is removed to expose a top surface of the metal gate layer 13 at the next level below. For the example provided in FIG. 9, at least a portion of the semiconductor nanosheets 11A-Y, 11A-Z and 11B-Z are removed, thereby a portion of the top surface of the metal gate layer 13 surrounding the first semiconductor nanosheet 11A-X and a portion of the top surface of the metal gate layer 13 surrounding the third semiconductor nanosheets 11B-Y are exposed. Optionally, the entire semiconductor nanosheets 11A-Y, 11A-Z and 11B-Z and the ferroelectric layers 12 and the metal gate layers 13 surrounding thereto are removed. An insulation layer 19 can be formed to cover the memory region MR and be filled between the continuous top surface TS and the continuous bottom surface BS of the metal gate layers 13.

A plurality of conductive vias is formed to be connected with the exposed top surfaces of metal gate layers 13 from above. For the example provided in FIG. 9, a first conductive via WL1 is in direct contact with a top surface of the first semiconductor nanosheet 11A-X, a second conductive via WL2 is in direct contact with a top surface of the third semiconductor nanosheets 11B-Y, a third conductive via WL3 is in direct contact with a top surface of the sixth semiconductor nanosheets 11C-Z. But it should be noted that the position of the conductive vias can be adjusted based on needs or design rules. The conductive vias can be electrically connected to other semiconductor nanosheets and the metal gate layers 13 surrounding thereto as long as such semiconductor nanosheets is not entirely covered by another semiconductor nanosheets at an upper level in the same region. It should be noted that the conductive vias can be connected to a word line or serve as extensions of the word lines in the memory device 1*, wherein each of the conductive vias can be connected in parallel. The word line may dictate the amount of charges accumulated in the nanosheets. Furthermore, each of the conductive vias are surrounded by the insulation layer 19.

By implementing ALD operation for forming the ferroelectric layers 12 with less thickness (e.g. <5 nm), the charge storage layer can be incorporated into nanosheet/nanowire structures to form a memory device including a ferroelectric field effect transistor (FeFET). Such memory device may be operated under a lower power (e.g. less than 5V) while having a comparable memory performance comparing to comparative embodiments of memories not using nanosheet/nanowire structures, which often requires power more than 5V. Such three dimensional FeFET structure also have a higher device density than a comparative embodiment of a planar memory structure (In some cases, can be more than three times). Furthermore, by the configuration of the connection of the metal gate layers 13, the word lines, the bit lines, and the epitaxial features, a plurality of memory devices can be connected to constitute a larger memory cell array. In some embodiments, the structures and the methods can be implemented on memory devices, such as flash memory, NOR memory, or the like.

Some embodiments of the present disclosure provide a semiconductor structure, including a substrate having a memory region and a logic region, the memory region including a first group of nanosheets vertically arranged over a first region of the substrate, wherein the first group of nanosheets includes: a first semiconductor nanosheet, a second group of nanosheets vertically arranged over a second region of the substrate adjacent to the first region, wherein the second group of nanosheets includes: a second semiconductor nanosheet, and a third semiconductor nanosheet over the second semiconductor nanosheet, a first metal gate layer surrounding the first semiconductor nanosheet, and a second metal gate layer surrounding the second semiconductor nanosheet, wherein the first metal gate layer is in direct contact with the second metal gate layer.

Some embodiments of the present disclosure provide a memory device, including a substrate, a first group of nanosheets vertically arranged over a first region of the substrate, wherein the first group of nanosheets includes a first semiconductor nanosheet, and a second semiconductor nanosheet over the first semiconductor nanosheet, a first ferroelectric layer surrounding the first semiconductor nanosheet, and a first metal gate layer surrounding the first ferroelectric layer.

Some embodiments of the present disclosure provide a method for fabricating a semiconductor structure, including forming a semiconductor stack over a substrate, wherein the semiconductor stack comprises a plurality of first semiconductor layers and a plurality of second semiconductor layers alternatively stacked, patterning the semiconductor stack to form a first fin and a second fin adjacent to the first fin, removing the second semiconductor layers to obtain a first group of nanosheets over the first fin and a second group of nanosheets over the second fin, wherein a lateral spacing between one of the nanosheets in the first group and a corresponding nanosheet in the second group is smaller than a vertical spacing between each of the nanosheets in the first group.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:
1. A semiconductor structure, comprising:
 a substrate having a memory region and a logic region, wherein the memory region comprises:
  a first group of nanosheets vertically arranged over a first region of the substrate, wherein the first group of nanosheets comprises:
   a first semiconductor nanosheet;

a second group of nanosheets vertically arranged over a second region of the substrate adjacent to the first region, wherein the second group of nanosheets comprises:
   a second semiconductor nanosheet; and
   a third semiconductor nanosheet over the second semiconductor nanosheet;
a first metal gate layer surrounding the first semiconductor nanosheet; and
a second metal gate layer surrounding the second semiconductor nanosheet, wherein the first metal gate layer is in direct contact with the second metal gate layer.

2. The semiconductor structure of claim 1, further comprising a third metal gate layer surrounding the third semiconductor nanosheet, wherein the third metal gate layer is physically separated from the second metal gate layer.

3. The semiconductor structure of claim 1, wherein a top surface of the first metal gate layer and a top surface of the second metal gate layer constitute a continuous surface.

4. The semiconductor structure of claim 3, wherein a top surface of the first metal gate layer and a top surface of the second metal gate layer comprise a dimple between the first semiconductor nanosheet and the second semiconductor nanosheet.

5. The semiconductor structure of claim 1, further comprising:
a first distance between the second semiconductor nanosheet and the third semiconductor nanosheet;
a second distance between the second semiconductor nanosheet and the first semiconductor nanosheet, wherein the first distance is greater than the second distance.

6. The semiconductor structure of claim 1, further comprising a first conductive via connected to a top surface of the first metal gate layer.

7. The semiconductor structure of claim 6, further comprising a second conductive via connected to a top surface of the third metal gate layer, wherein the first conductive via and the second conductive via are connected in parallel.

8. The semiconductor structure of claim 1, further comprising a ferroelectric layer between the first semiconductor nanosheet and the first metal gate layer.

9. A memory device, comprising:
a substrate;
a first group of nanosheets vertically arranged over a first region of the substrate, wherein the first group of nanosheets comprises:
   a first semiconductor nanosheet; and
   a second semiconductor nanosheet over the first semiconductor nanosheet;
a first ferroelectric layer surrounding the first semiconductor nanosheet; and
a first metal gate layer surrounding the first ferroelectric layer.

10. The memory device of claim 9, further comprising:
a second group of nanosheets vertically arranged over a second region of the substrate adjacent to the first region, wherein the second group of nanosheets comprises:
   a third semiconductor nanosheet; and
   a second ferroelectric layer surrounding the third semiconductor nanosheet.

11. The memory device of claim 10, wherein the first ferroelectric layer is physically separated from the second ferroelectric layer.

12. The memory device of claim 10, further comprising:
a first epitaxial feature connected to a first end of each of the first semiconductor nanosheet and the second semiconductor nanosheet; and
a second epitaxial feature connected to a second end of each of the first semiconductor nanosheet and the second semiconductor nanosheet, wherein the first end is opposite to the second end.

13. The memory device of claim 12, wherein one of the first epitaxial feature and the second epitaxial feature is a bit line.

14. The memory device of claim 12, wherein the first ferroelectric layer comprises a hafnium oxide-based material.

15. The memory device of claim 9, further comprising:
a first conductive via electrically coupled to the first semiconductor nanosheet and the third semiconductor nano sheet;
a second conductive via electrically coupled to the second semiconductor nanosheet.

16. A semiconductor structure, comprising:
a substrate;
a first group of nanosheets at a first level above the substrate, comprising:
   a first semiconductor nanosheet over a first region;
   a second semiconductor nanosheet over a second region adjacent to the first region; and
   a first gate layer at least partially surrounding the first semiconductor nanosheet and the second semiconductor nanosheet;
a second group of nanosheets at a second level above the first level, comprising:
   a third semiconductor nanosheet over the first region; and
   a conductive via over the second region, wherein the conductive via is connected to a top surface of the first gate layer.

17. The semiconductor structure of claim 16, wherein the conductive via comprises a portion at a level above a top surface of the third semiconductor nanosheet.

18. The semiconductor structure of claim 16, further comprising a ferroelectric layer between the first semiconductor nanosheet and the first gate layer.

19. The semiconductor structure of claim 18, wherein a thickness of the ferroelectric layer is less than 5 nm.

20. The semiconductor structure of claim 16, wherein the first gate layer comprises:
a first portion at least partially surrounding the first semiconductor nanosheet;
a second portion at least partially surrounding the second semiconductor nanosheet; and
a third portion merging the first portion and the second portion.

\* \* \* \* \*